(12) United States Patent
Mohanty et al.

(10) Patent No.: US 10,274,651 B1
(45) Date of Patent: Apr. 30, 2019

(54) MANUFACTURING THREE-DIMENSIONAL DIFFRACTION GRATINGS BY SELECTIVE DEPOSITION OR SELECTIVE ETCHING

(71) Applicant: Facebook Technologies, LLC, Menlo Park, CA (US)

(72) Inventors: Nihar Ranjan Mohanty, Redmond, WA (US); Giuseppe Calafiore, Redmond, WA (US); Matthew E. Colburn, Woodinville, WA (US); Austin Lane, Redmond, WA (US); Matthieu Charles Raoul Leibovici, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/875,848

(22) Filed: Jan. 19, 2018

(51) Int. Cl.
    *G02B 5/18* (2006.01)
    *B44C 1/22* (2006.01)
    *B29D 11/00* (2006.01)

(52) U.S. Cl.
    CPC .................................. *G02B 5/1857* (2013.01)

(58) Field of Classification Search
    None
    See application file for complete search history.

(56) References Cited

U.S. PATENT DOCUMENTS

| | | | | | |
|---|---|---|---|---|---|
| 4,124,473 | A | * | 11/1978 | Lehmann | G02B 5/1842 204/192.32 |
| 5,300,190 | A | * | 4/1994 | Sugimoto | G02B 6/124 216/24 |
| 2002/0030890 | A1 | * | 3/2002 | Kato | G02B 5/18 359/576 |
| 2002/0141023 | A1 | * | 10/2002 | Yamada | G02B 26/106 359/198.1 |
| 2008/0061230 | A1 | * | 3/2008 | Wang | B82Y 35/00 250/306 |

* cited by examiner

*Primary Examiner* — Shamim Ahmed
(74) *Attorney, Agent, or Firm* — Fenwick & West LLP

(57) ABSTRACT

A three-dimensional diffraction grating is generated by selective deposition and/or selective etching. The three-dimensional diffraction grating includes a substrate and a plurality of structures located at different positions on the substrate. The structures have different materials. Edges of at least some of the structures are aligned. The three-dimensional diffraction grating includes different materials and aligned edges in all three dimensions. With the different materials and aligned edges, the three-dimensional diffraction gratings is configured to eliminate display artifacts, such as ghost, rainbow, etc.

4 Claims, 6 Drawing Sheets

Before Selective Deposition

After Selective Deposition

Before Selective Etch

After Selective Etch

300

MANUFACTURING THREE-DIMENSIONAL DIFFRACTION GRATINGS BY SELECTIVE DEPOSITION OR SELECTIVE ETCHING

BACKGROUND

Field of the Disclosure

The present disclosure generally relates to fabricating diffraction gratings, and specifically to a fabricating three-dimensional diffraction gratings by selective deposition or selective etching.

Description of the Related Arts

Three-dimensional diffraction gratings are used in various optical devices to perform certain optical functions such as eliminating artifacts or processing color in images. These diffraction gratings typically have ridges or rulings on surface and may be made of different materials and have certain patterns. Some applications may use diffraction gratings of three-dimensional profiles or shapes that are difficult to generate using conventional fabrication methods.

SUMMARY

Embodiments relate to three-dimensional diffraction gratings generated by selective deposition or selective etching. A three-dimensional diffraction grating includes a substrate and a plurality of structures located at different positions on the substrate. A structure is an optical component configured to refract light. At least some of the structures have different materials. The different materials are associated with different refractive indexes.

In some embodiments, a three-dimensional diffraction grating is generated by selective deposition. For example, a material with selective surface chemistry is deposited on a substrate where a plurality of structures are located. The material is selectively deposited on some of the plurality of structures but not deposited on the other structures. The selective disposition also results in self-aligned edges of the deposited material with the some of the plurality of structures.

In some other embodiments, a three-dimensional diffraction grating is generated by selective etching. For example, a material is deposited on a substrate where a plurality of structures are located. The material is further etched. But the material is selectively etched from some of the structures, and not etched from the other structures. The selective etch results in self-aligned edges of the material with the other structures.

BRIEF DESCRIPTION OF THE DRAWINGS

The teachings of the embodiments can be readily understood by considering the following detailed description in conjunction with the accompanying drawings.

Figure 1:
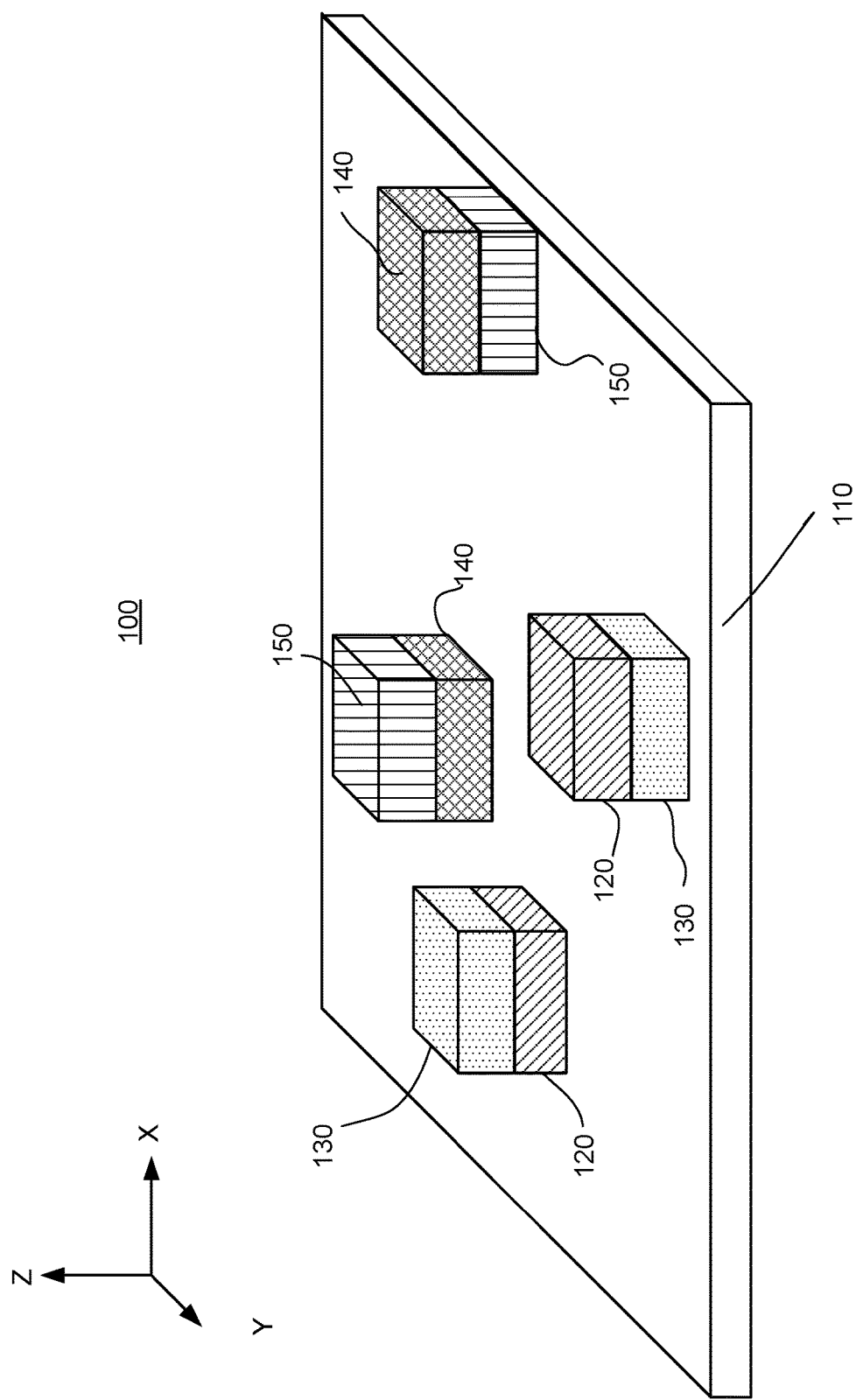
FIG. 1 is an example schematic perspective view of a three-dimensional diffraction grating, in accordance with an embodiment.

The figures depict various embodiments for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digits of each reference number corresponds to the figure in which the reference number is first used.

Embodiments relate to a three-dimensional diffraction gratings generated by selective deposition or selective etching. The three-dimensional diffraction grating includes a substrate and a plurality of structures at different positions on the substrate. The structures have different materials. Edges of at least some of the structures are aligned. In some embodiments, one or more edges of the structures are aligned with one or more edges of the substrate. The materials and structure of the three-dimensional diffraction gratings result in advantageous optical properties. For example, display artifacts, such as ghost, rainbow, etc., can be eliminated.

Embodiments may be used for optical processing associated with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a 3D effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The language used in the specification has been principally selected for readability and instructional purposes, and it may not have been selected to delineate or circumscribe the inventive subject matter. It is therefore intended that the scope be limited not by this detailed description, but rather by any claims that issue on an application based hereon. Accordingly, the disclosure of the embodiments is intended to be illustrative, but not limiting, of the scope, which is set forth in the following claims.

FIG. 1 is an example schematic perspective view of a three-dimensional diffraction grating 100, in accordance with an embodiment. The three-dimensional diffraction grating 100 is an optical component that diffracts incoming light into several beams travelling in different directions. The directions of the beams is based in part on structure and optical properties of materials (e.g., refractive index) of the three-dimensional diffraction grating 100. Accordingly, particular directions of the beams can be achieved by selecting appropriate structure and materials of the three-dimensional diffraction grating 100.

In the embodiment of FIG. 1, the three-dimensional diffraction grating 100 includes different material and has a three-dimensional structure. In the X-Y plane, the three-dimensional diffraction grating 100 includes a plurality of structures 120, 130, 140, 150 located at different portions of a substrate 110. The structures 120, 130, 140, 150 include different layers of materials in Z-direction. Each material is represented by a different pattern in FIG. 1.

As shown in FIG. 1, the structures 120, 130, 140, 150 constitute four structural stacks: the structure 120 on top of the structure 130, the structure 130 on top of the structure 120, the structure 140 on top of the structure 150, and the structure 150 on top of the structure 140. The edges of each structure is aligned with corresponding edges of the other structure of the same stack. In the embodiment of FIG. 1, edges of the structure 150 are aligned with edges of the substrate 110. The alignment of the edges of different materials (e.g., materials having different refractive indexes) eliminates one or more types of display artifacts, such as ghost, rainbow, etc.

The structure 120 has a same size as the structure 130, and the structure 140 has a same size as the structure 150. In other embodiments, the three-dimensional diffraction grating 100 can have a different number of structures, have different shapes or sizes, and be located at different portions of the substrate 110.

In the embodiment of FIG. 1, the structures 120, 130, 140, 150 are made of different materials. In some embodiments, the structures 120, 130, 140, 150 are made of optically transparent films, including but not limited to silicon dioxide, silicon nitride, silicon carbide, silicon oxy nitride, silicon carbo-oxy nitride, silicon carboxyl oxide, carbon rich layers, aluminium oxide, aluminium nitride, titanium dioxide, hafnium oxide, tantalum oxide, gallium phosphide, zirconium oxide, other types of materials of optically transparent films, or any combination thereof. In some embodiments, materials of the structures 120, 130, 140, 150 are selected based on their refractive indexes. For example, a combination of the materials of the structures 120 and 130 (or the structures 140 and 150) are selected based on the differences in their refractive indexes, in order to achieve requirements on optical properties of the three-dimensional diffraction grating 100. Alternatively or additionally, the materials of the structures 120, 130, 140, 150 are selected based on their fabrication limitations, such as relative etch selectivity, relative selectivity for deposition, etc.

In the embodiment of FIG. 1, the substrate 110 and the structures 120, 130, 140, 150 are cuboid. However, in other embodiments, the substrate 110 and the structures 120, 130, 140, 150 can have other shapes. For example, a structure can have a cross-section that is a triangle. Similarly, a cross-section of the substrate 110 can be a triangle.

Figure 2A:
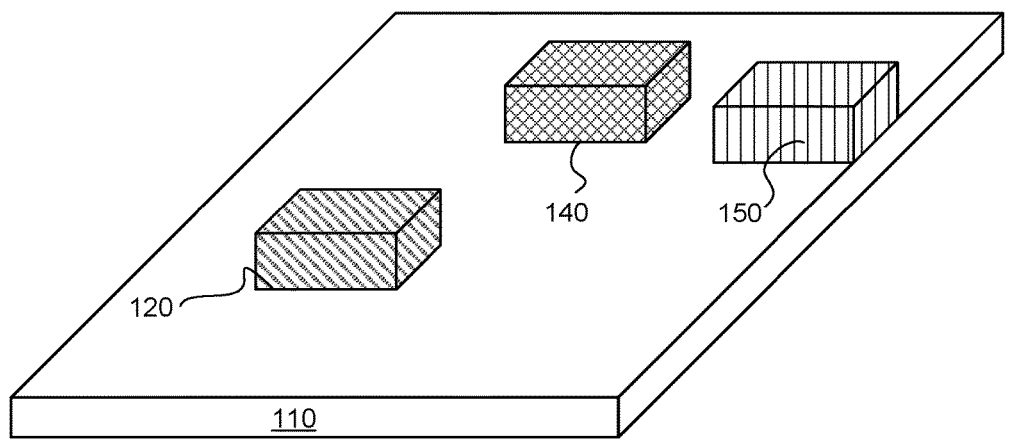
FIGS. 2A and 2B illustrate generation of a three-dimensional diffraction grating having multiple materials and aligned edges by selective deposition, in accordance with an embodiment.
Figure 2B:
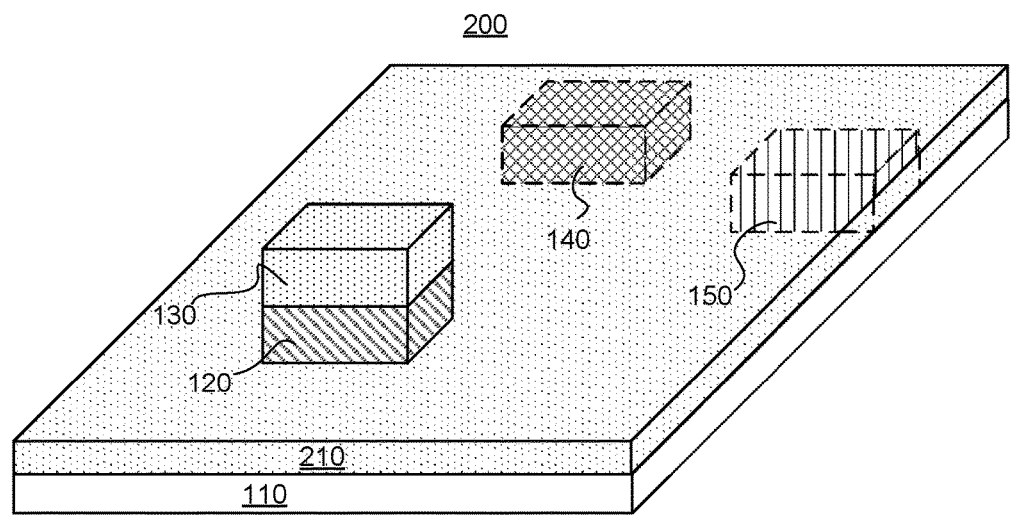

FIGS. 2A and 2B illustrate fabrication of a three-dimensional diffraction grating 200 having multiple materials and aligned edges by selective deposition, in accordance with an embodiment. Prior to the selective deposition, as illustrated in FIG. 2A, three structures 120, 140, and 150 are located on a substrate 110. In some embodiments, the three structures 120, 140, and 150 can be deposited onto the substrate 110.

After the selective deposition, as illustrated in FIG. 2B, the substrate 110 is coated with a structure 210 and the structure 120 is coated with the structure 130. The structures 210 and 130 are of the same material. However, the structures 140 and 150 are not coated with the structure 130 or the structure 210. The structures 140 and 150 are shown in broken lines in FIG. 2B because at least part of the structure 140 and at least part of the structure 150 are invisible due to deposition of the structure 210 on the substrate 110. Consequently, the three-dimensional diffraction grating 200 includes the substrate 110, the structure 210, the structure 120 at the bottom of the structure 130, the structure 140, and the structure 150. In the three-dimensional diffraction grating 300, edges of the structure 210 are aligned with the edges of the substrate 110, and edges of the structure 130 are aligned with edges of the structure 120. In some embodiments, the process of coating of the structure 210 may be omitted.

The selective deposition involves a process of depositing materials and films in desired locations. One way of performing selective deposition is to use selective bottom up growth of materials on specific material surfaces and not on other surfaces, which results in continued dimensional scaling and accurate pattern placement. The materials that can be deposited are optically transparent materials, including but not limited to silicon dioxide, silicon nitride, silicon carbide, silicon oxy nitride, silicon carbo-oxy nitride, silicon carboxyl oxide, carbon rich layers, aluminium oxide, aluminium nitride, titanium dioxide, hafnium oxide, tantalum oxide, gallium phosphide, zirconium oxide, other types of optically transparent materials, or any combination thereof.

The selective deposition may take advantage of surface chemistry and selectivity, which includes factors related to reactivities with different materials, deactivation of reactive sites on materials, different diffusion rates into different materials, aspect ratio dependent deposition and etch effects, etc. In one embodiment, material of the structure 130 is selected based on surface chemistry that allows the structure 130 to grow on the substrate 110 and the structure 120 but not on the structures 140 and 150. In an alternative embodiment, materials of the substrate 110 and the structures 120, 140, and 150 are selected so that they have surface chemistry allowing the structure 130 to grow on the substrate 110 and the structure 120 but not on the structures 140 and 150.

In another alternative embodiment, a self-assembly monolayer is attached on the structures 140 and 150, but not on the substrate 110 and the structure 120. Surface energies of the structures 140 and 150 are changed due to the self-assembly monolayer, which precludes the structure 130 from adhering on the structures 140 and 150. In another alternative embodiment, line-of-sight deposition is used to deposit the structure 130. With the line-of-sight deposition, thickness of the structure 130 deposited on the substrate 110 and the structure 120 is higher than that on the structures 140 and 150. Etching is conducted following the line of sight deposition so that the structure 130 deposited on the structures 140 and 150 is removed, leaving the structure 130 on top of the substrate 110 and the structure 120.

The selective deposition may be performed using physical vapor deposition, chemical vapor deposition (including plasma enhanced chemical vapor deposition and low pressure chemical vapor deposition), atomic layer deposition, molecular layer deposition, electrochemical deposition, or any combination thereof.

As shown in FIG. 2B, not only the structure 130 is selectively deposited on the substrate 110 and the structure 120 (not the structures 140 and 150), but also edges of the structure 130 are self-aligned with edges of the substrate 110 and edges of the structure 120. Such alignment is advantageously enables the three-dimensional diffraction grating 200 to achieve preferred optical properties.

Figure 3A:
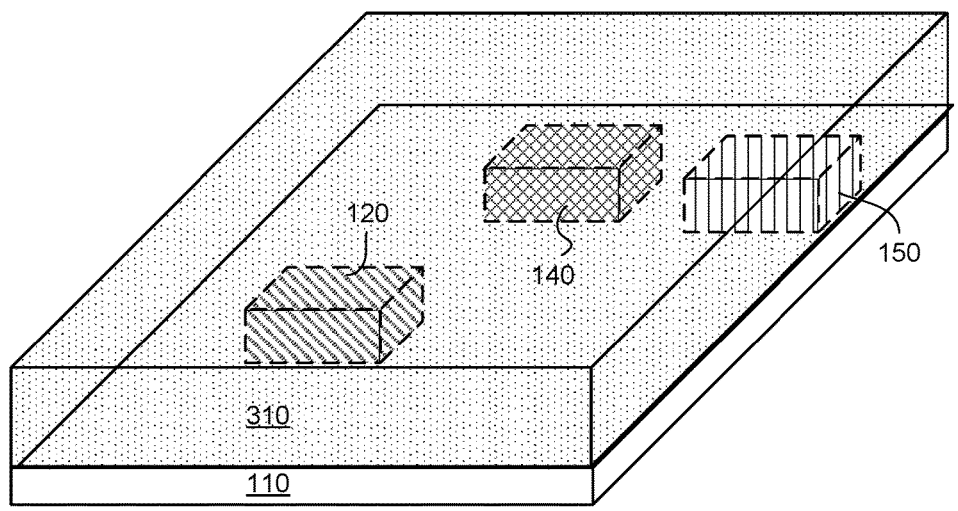
FIGS. 3A and 3B illustrate generation of a three-dimensional diffraction grating having multiple materials and aligned edges by selective etch, in accordance with an embodiment.
Figure 3B:
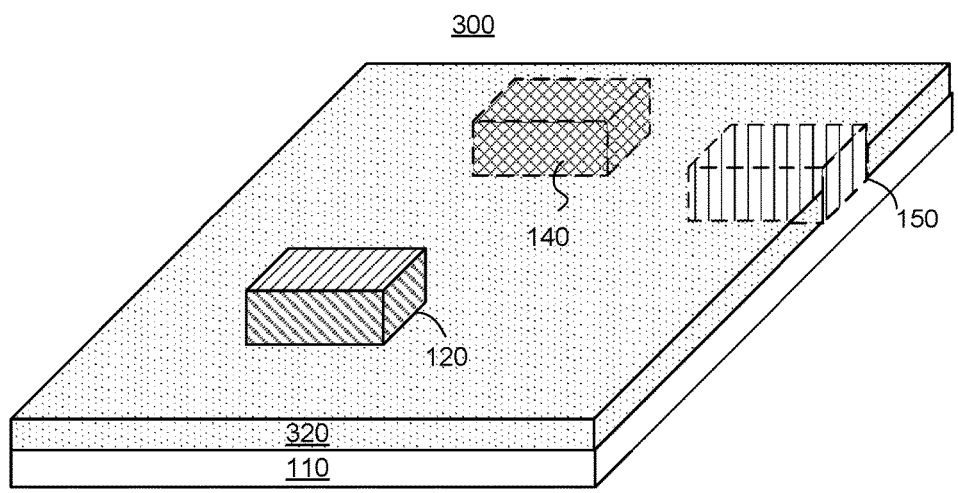

FIGS. 3A and 3B illustrate fabrication of a three-dimensional diffraction grating 300 having multiple materials and aligned edges by selective etching, in accordance with an embodiment. Prior to the selective etch, as illustrated in FIG. 3A, three structures 120, 140, and 150 are located on a substrate 110. Also, the structures 120, 140, and 150 and the substrate 110 are all coated with a structure 310 structure. In some embodiments, the three structures 120, 140, and 150 can be deposited onto the substrate 110. Similarly, the structure 310 can be deposited onto the structures 120, 140, and 150 and the substrate 110. In the embodiment of FIGS. 3A and 3B, the material of the structure 310 has high selectivity to materials of the substrate 110 and the structures 120, 140, and 150.

During the selective etch, the structure 310 is etched off and consequently forms a structure 320, as illustrated in FIG. 3B. But the three structures 120, 140, and 150 and the substrate 110 are not etched. Consequently, after the selective etch, the three-dimensional diffraction grating 300 is formed. The three-dimensional diffraction grating 300 includes the substrate 110, the structure 320 on top of the substrate 110, the structure 120, the structure 140, and the structure 150. In the three-dimensional diffraction grating 300, edges of the structure 320 are aligned with the edges of the substrate 110.

In some embodiments, the selective etch includes plasma etching, wet chemical etching, vapor phase etching, other types of etching, or any combination thereof with or without the assistance of photolithography. Taking plasma etching as an example, plasma removes some of the structure 310 without removing any of the substrate 110 or the structures 120, 140, and 150. The chemistry, density and energy of plasma may be controlled to achieve a preferred thickness of the structure 320. In some embodiments, the plasma is chlorine-based plasma for semiconductor etching (e.g., $ClF_3$, $Cl_2$, or $BCl_3$ plasma), bromine based plasma for semiconductor etching (e.g. HBr or Br2), or fluorine based plasma for semiconductor etching (e.g., $CF_4$, $CHF_3$, $CH_2F_2$, $CH_3F$, $NF_3$, $SF_6$, $F_2$, $HF$, $C_4F_8$, $C_4F_6$, $ClF_3$, etc.). In some embodiments, the plasma etching process is done in conjunction with lithographic process such as structures formed by submicron patterning using electron-beam, interferometric, or nano-imprint lithography.

Figure 4:
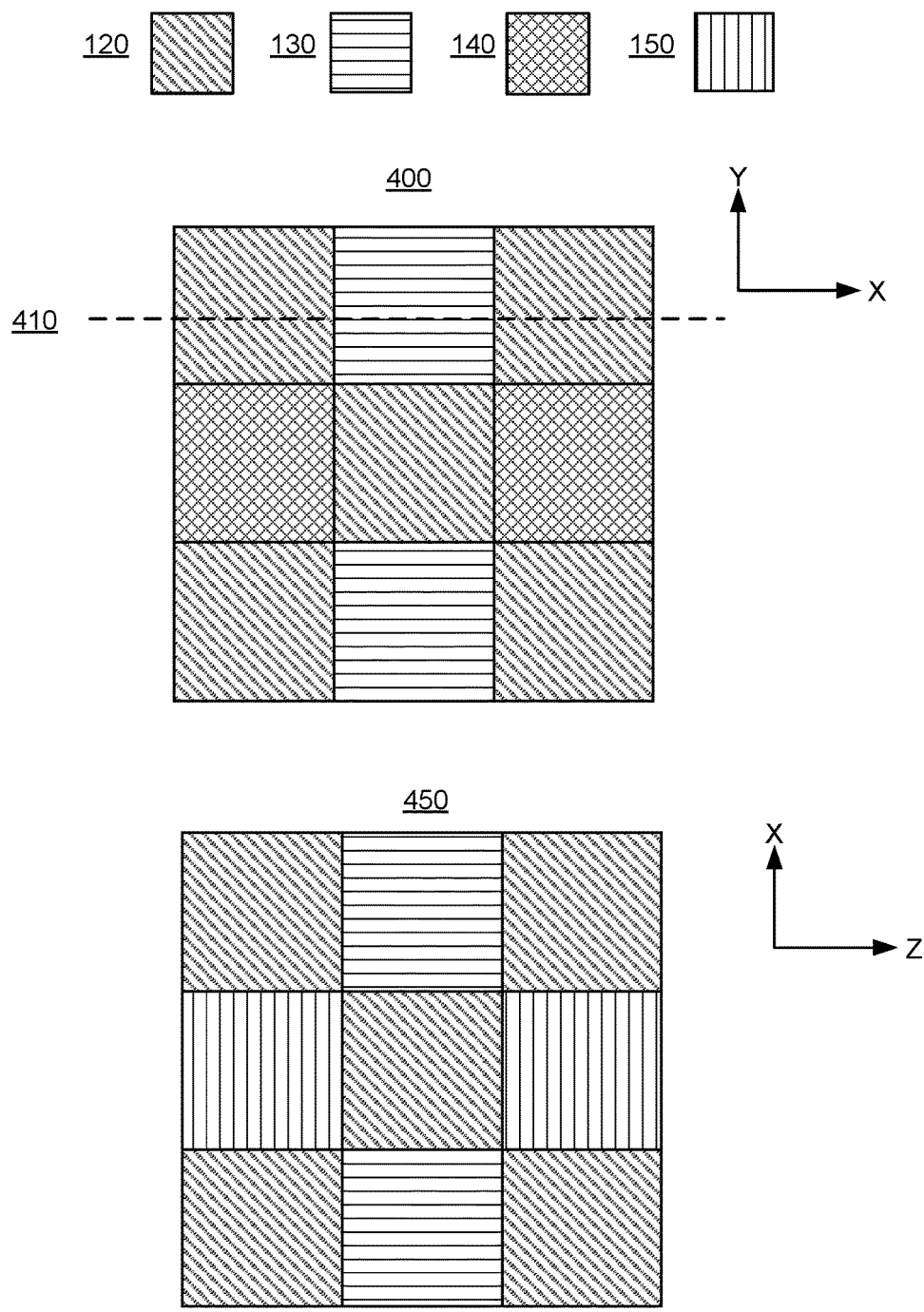
FIG. 4 is shows a three-dimensional diffraction grating having multiple materials and self-aligned edges in all three dimensions, in accordance with an embodiment.

FIG. 4 illustrates a three-dimensional diffraction grating having multiple materials and self-aligned edges in all three dimensions, in accordance with an embodiment. The three dimensions, i.e., X, Y, and Z, are shown in FIG. 4. In the embodiment of FIG. 4, the three-dimensional diffraction grating includes 27 structures that include four different materials. The structures 120 all have the same material, same as the structures 130, the structures 140, and the structures 150. In other embodiments, the three-dimensional diffraction grating may have a different number of structures and/or a different number of types of materials.

FIG. 4 includes two images 400 and 450. The image 400 shows a top-down view of the three-dimensional diffraction grating in an X-Y plane. In the image 400, there are nine structures, edges of which are all aligned. The nine structures includes five structures 120, two structures 130, and two structures 140. Thus, there are three different materials in the nine structures. The image 400 includes a line 410. A cross-section of the three-dimensional diffraction grating in an X-Z plane at the line 410 is shown in the image 450. The image 450 shows nine structures, including five structures 120 and four two structures 150. Edges of all the nine structures are aligned. Thus, based on the images 400 and 450, edges of the 27 structures in the three-dimensional diffraction grating are all aligned.

The three-dimensional diffraction grating have multiple materials and self-aligned edges in all three dimensions. This unique design is configured to eliminate many of artifacts of AR or MR display systems. An example of the artifacts is external stray light diffraction into a viewer's eyes which forms a bright rainbow. This design eliminates this artifact by enabling un-intended diffraction order cancellation through in-phase and out-of-phase coupling of stray light.

Figure 5:
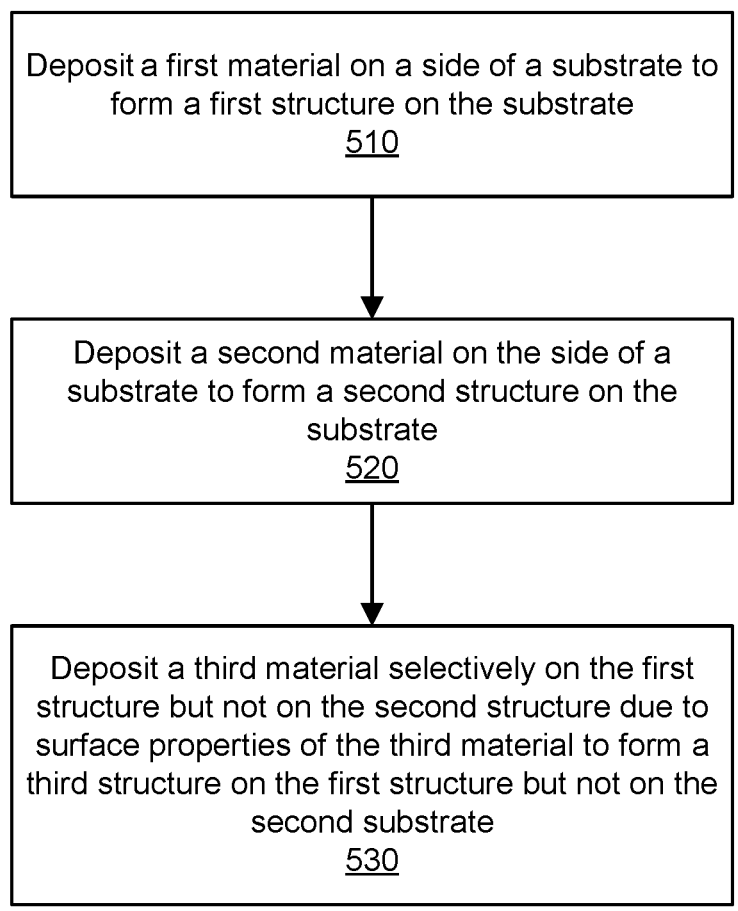
FIG. 5 is a flow chart illustrating a process for fabricating a three-dimensional diffraction grating by selective deposition, in accordance with an embodiment.

FIG. 5 is a flow chart illustrating a process 500 for fabricating a three-dimensional diffraction grating by selective deposition, in accordance with an embodiment. The process 500 may include different or additional steps than those described in conjunction with FIG. 5 in some embodiments or perform steps in different orders than the order described in conjunction with FIG. 5.

The process 500 includes depositing 510 a first material on a side of a substrate to from a first structure on the substrate. The process 500 also includes depositing 520 a second material on the side of a substrate to form a second structure on the substrate. The process 500 further includes depositing 530 a third material selectively on the first structure but not on the second structure due to surface properties of the third material to form a third structure on the first structure but not on the second substrate. Depositing the third material is after depositing the first material and the second material. The third material has surface properties allowing to form the third structure on the first structure but not on the second substrate. For example, the third material has a high diffusion rate of diffusing to the first material but a low diffusion rate of diffusing to the second material. Edges of the third structure can be self-aligned with edges of the first structure. The first, second, and third structures are optical components configured to refract light. In some embodiments, the first, second, and third materials have different refractive indexes.

Figure 6:
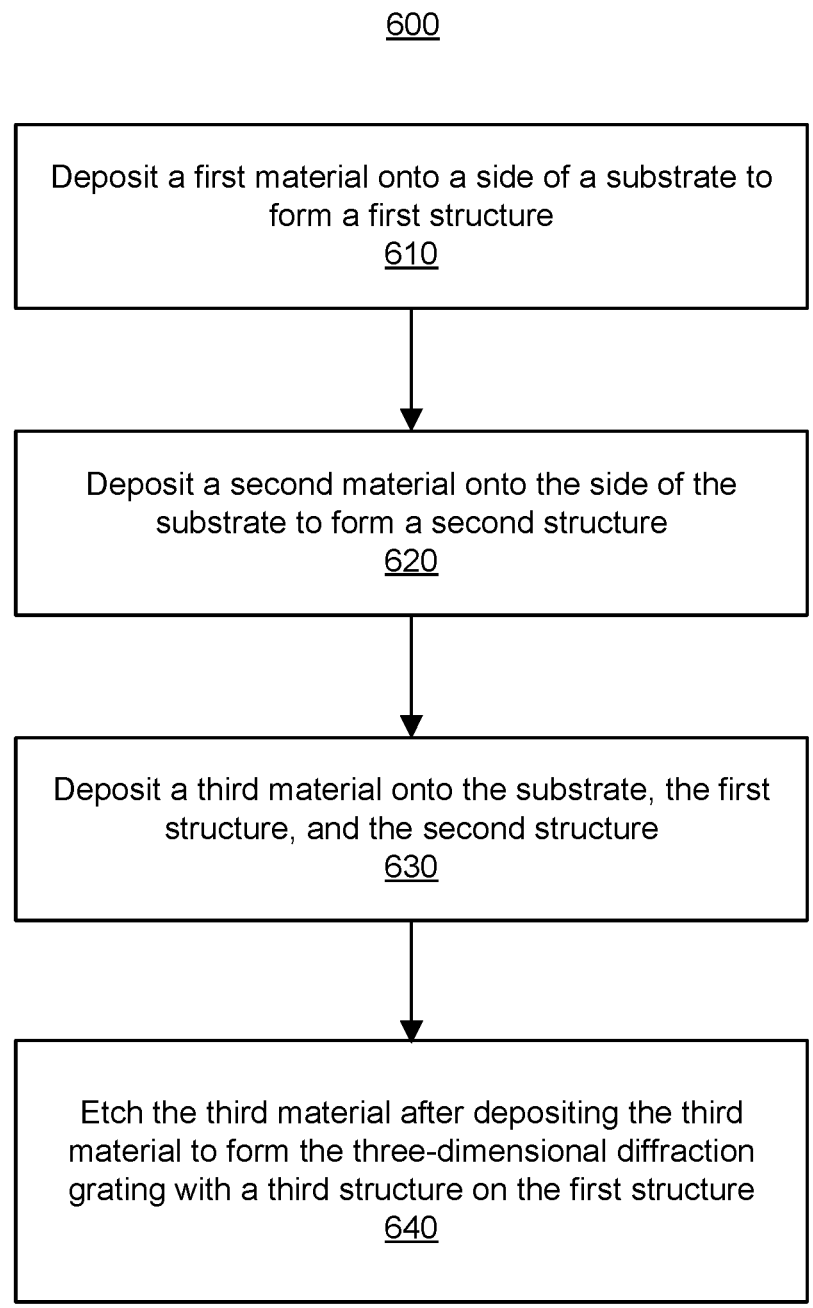
FIG. 6 is a flow chart illustrating a facial rendering process for fabricating a three-dimensional diffraction grating by selective etching, in accordance with an embodiment.

FIG. 6 is a flow chart illustrating a facial rendering process 600 for fabricating a three-dimensional diffraction grating by selective etching, in accordance with an embodiment. The process 600 may include different or additional steps than those described in conjunction with FIG. 6 in some embodiments or perform steps in different orders than the order described in conjunction with FIG. 6.

The process 600 includes depositing 610 a first material on a side of a substrate to from a first structure on the substrate. The process 600 also includes depositing 620 a second material on the side of a substrate to form a second structure on the substrate. The process 600 also includes depositing 630 a third material onto second substrate, the first structure and the second structure. The process 600 also includes etching 640 the third material after depositing the third material to form the three-dimensional diffraction grating with a third structure on the first structure. The third material has surface properties allowing portions of the third material on the substrate and the first structure to be etched away but retain portions of the third material on the second structure. Edges of the third structure can be self-aligned with edges of the first structure. The first, second, and third structures are optical components configured to refract light. In some embodiments, the first, second, and third materials have different refractive indexes.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method for generating a three-dimensional diffraction grating, comprising:

depositing a first material onto a side of a substrate to form a first structure;

depositing a second material onto the side of the substrate to form a second structure;

depositing a third material onto the substrate, the first structure and the second structure; and etching the third material after depositing the third material to form the three-dimensional diffraction grating with a third structure on the first structure, the third material having surface properties allowing portions of the third material on the substrate and the second structure to be etched away but retain portions of the third material on the first structure.

2. The method of claim 1, wherein edges of the third structure self-aligned with edges of the first structure.

3. The method of claim 1, wherein the first, second, and third materials are associated with three different refractive indexes.

4. The method of claim 1, wherein the third material is selected from a group of materials including: silicon dioxide, silicon nitride, silicon carbide, silicon oxy nitride, silicon carbo-oxy nitride, silicon carboxyl oxide, carbon rich layers, aluminum oxide, aluminum nitride, titanium dioxide, hafnium oxide, tantalum oxide, gallium phosphide, zirconium oxide, or a combination thereof.

* * * * *